(12) United States Patent
Manning

(10) Patent No.: US 6,265,299 B1
(45) Date of Patent: *Jul. 24, 2001

(54) INTEGRATED CIRCUITRY FUSE FORMING METHODS, INTEGRATED CIRCUITRY PROGRAMMING METHODS, AND RELATED INTEGRATED CIRCUITRY

(75) Inventor: H. Montgomery Manning, Kuna, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/556,245

(22) Filed: Apr. 24, 2000

Related U.S. Application Data

(63) Continuation of application No. 09/393,548, filed on Sep. 10, 1999, which is a continuation of application No. 09/015,414, filed on Jan. 29, 1998, now Pat. No. 5,976,917.

(51) Int. Cl.[7] .............................. H01L 24/44; H01L 21/82
(52) U.S. Cl. ........................ 438/601; 438/132; 438/601; 438/625; 257/529; 257/665
(58) Field of Search .................................... 438/132, 601, 438/625, 696; 257/529

(56) References Cited

U.S. PATENT DOCUMENTS

| | | | |
|---|---|---|---|
| 3,647,585 | 3/1972 | Fritzinger et al. | 216/15 |
| 4,032,949 | 6/1977 | Bierig | 257/529 |
| 4,198,744 | 4/1980 | Nicolay | 438/601 |
| 4,460,914 | 7/1984 | te Velde et al. | 257/529 |
| 4,517,583 | 5/1985 | Uchica . | |
| 4,757,359 | 7/1988 | Chiao et al. | 357/23.5 |
| 4,782,380 | 11/1988 | Shankar et al. | 257/764 |
| 4,814,853 | 3/1989 | Uchida | 357/51 |
| 4,847,732 | 7/1989 | Stopper et al. | 361/739 |
| 4,935,801 | 6/1990 | McClure et al. | 257/529 |
| 4,984,054 | 1/1991 | Yamada et al. | 357/51 |
| 4,998,223 | 3/1991 | Akaogi | 365/230.03 |
| 5,015,604 | 5/1991 | Lim et al. | 257/529 |
| 5,070,392 | 12/1991 | Coffey et al. | 438/601 |
| 5,155,462 | 10/1992 | Morrill, Jr. | 337/3 |
| 5,244,836 | 9/1993 | Lim | 438/601 |
| 5,291,434 | 3/1994 | Kowalski | 257/529 |
| 5,376,820 | 12/1994 | Crafts et al. | 257/529 |
| 5,485,031 | 1/1996 | Zhang et al. | 257/530 |
| 5,614,440 | 3/1997 | Bezama et al. | 438/467 |
| 5,661,323 | 8/1997 | Choi et al. | 257/378 |
| 5,756,393 | 5/1998 | Dennison | 438/600 |
| 5,903,041 | 5/1999 | La Fleur et al. | 257/530 |
| 5,914,524 | 6/1999 | Komenaka | 257/529 |
| 5,949,127 | * 9/1999 | Lien et al. | 257/529 |
| 5,976,917 | 11/1999 | Manning | 438/132 |
| 6,060,398 | 5/2000 | Brintzinger et al. | 438/696 |
| 6,080,649 | 6/2000 | Werner et al. | 438/601 |

\* cited by examiner

*Primary Examiner*—Charles Bowers
*Assistant Examiner*—Asok K. Sarkar
(74) *Attorney, Agent, or Firm*—Wells, St. John, Roberts, Gregory & Matkin PS

(57) ABSTRACT

Integrated circuitry fuse forming methods, integrated circuitry programming methods, and related integrated circuitry are described. In one implementation, a first layer comprising a first conductive material is formed over a substrate. A second layer comprising a second conductive material different from the first conductive material is formed over the first layer and in conductive connection therewith. A fuse area is formed by removing at least a portion of one of the first and second layers. In a preferred aspect, an assembly of layers comprising one layer disposed intermediate two conductive layers is provided. At least a portion of the one layer is removed from between the two layers to provide a void therebetween. In another aspect, programming circuitry is provided over a substrate upon which the assembly of layers is provided. The programming circuitry comprises at least one MOS device which is capable of being utilized to provide a programming voltage which is sufficient to blow the fuse, and which is no greater than the breakdown voltage of the one MOS device.

33 Claims, 3 Drawing Sheets

US 6,265,299 B1

INTEGRATED CIRCUITRY FUSE FORMING METHODS, INTEGRATED CIRCUITRY PROGRAMMING METHODS, AND RELATED INTEGRATED CIRCUITRY

CROSS REFERENCE TO RELATED APPLICATION

This is a Continuation of U.S. patent application Ser. No. 09/393,548, filed Sep. 10, 1999, and titled "Integrated Circuitry Fuse Forming Methods, Integrated Circuitry Programming Methods, and Related Integrated Circuitry", which is a Continuation of U.S. patent application Ser. No. 09/015,414, filed Jan. 29, 1998, now U.S. Pat. No. 5,976,917.

TECHNICAL FIELD

This invention relates to integrated circuitry fuse forming methods, integrated circuitry programming methods, and integrated circuitry comprising programmable integrated circuitry.

BACKGROUND OF THE INVENTION

Some types of integrated circuitry utilize fuses. A fuse is a structure which can be broken down or blown in accordance with a suitable electrical current which is provided through the fuse to provide an open circuit condition. Within the context of integrated circuitry memory devices, fuses can be used to program in redundant rows of memory. Fuses have use in other integrated circuitry applications as well.

One problem associated with integrated circuitry fuses is that the voltage required to provide the necessary current to blow the fuse can be very high, e.g., on the order of 10 volts. Because of this, memory circuitry utilizing MOS logic cannot typically be used to route an appropriate programming signal or current to the fuse since the voltage required to do so would break down the gate oxide of the MOS device. One solution has been to provide a dedicated contact pad for each fuse so that the desired programming voltage can be applied directly to the fuse from an external source without the use of the MOS devices. Providing a dedicated contact pad, however, utilizes valuable silicon real estate which could desirably be used for supporting other memory devices.

This invention arose out of concerns associated with providing improved integrated circuitry fuse forming methods and resultant fuse constructions suitable for programming at relatively low programming voltages. This invention also arose out of concerns associated with conserving wafer real estate and providing integrated circuitry which incorporates such improved fuse constructions.

SUMMARY OF THE INVENTION

Integrated circuitry fuse forming methods, integrated circuitry programming methods, and related integrated circuitry are described. In one implementation, a first layer comprising a first conductive material is formed over a substrate. A second layer comprising a second conductive material different from the first conductive material is formed over the first layer and in conductive connection therewith. A fuse area is formed by removing at least a portion of one of the first and second layers. In a preferred aspect, an assembly of layers comprising one layer disposed intermediate two conductive layers is provided. At least a portion of the one layer is removed from between the two layers to provide a void therebetween. In another aspect, programming circuitry is provided over a substrate upon which the assembly of layers is provided. The programming circuitry comprises at least one MOS device which is capable of being utilized to provide a programming voltage which is sufficient to blow the fuse, and which is no greater than the breakdown voltage of the one MOS device.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
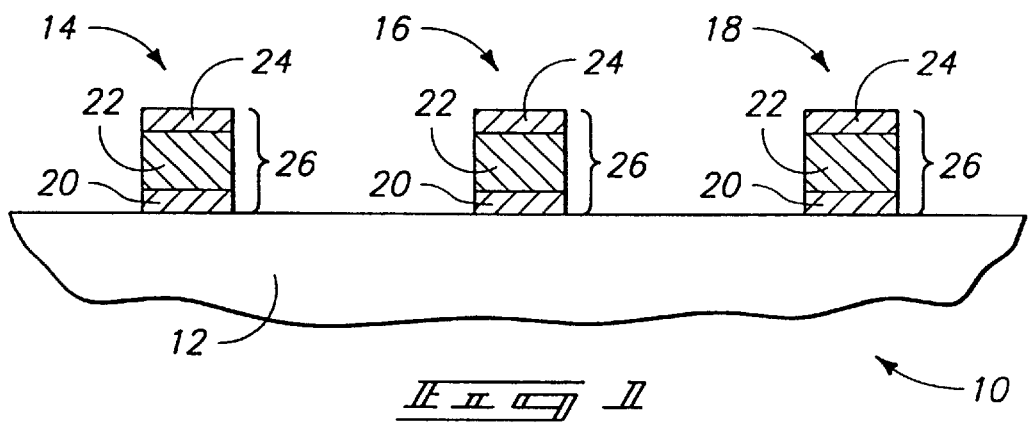
FIG. 1 is a diagrammatic sectional view of a semiconductor wafer fragment in process, undergoing processing in accordance with one aspect of the invention.

Referring to FIG. 1, a semiconductor wafer fragment in process is shown generally at 10 and comprises a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A plurality of stacks are formed over the substrate. Exemplary stacks are shown at 14, 16, 18. Each stack comprises a base layer 20, a first layer 22 formed over base layer 20, and a second layer 24 formed over first layer 22 and base layer 20. Collectively, layers 20, 22, 24 comprise assemblies 26 which include at least one layer, i.e., layer 22, disposed intermediate two other layers, i.e., layers 20, 24. The illustrated stacks run into and out of the plane of the page upon which FIG. 1 appears.

In the illustrated and preferred embodiment, each of layers 20, 22, and 24 comprise conductive materials and accordingly, are in conductive connection with a next adjacent layer. First layer 22 comprises a first conductive material and second layer 24 comprises a second conductive material which is different from the first conductive material. The first conductive material is also different from the material comprising base layer 20. In the illustrated example, layer 22 is etchably different from and more conductive than either of layers 20, 24 which will become apparent below. Exemplary materials for base layer 20 include titanium or titanium nitride; exemplary materials for first layer 22 comprise conductive metal materials such as aluminum, AlCu or some other suitable metal alloy; and an exemplary material for second layer 24 comprises titanium nitride. It is possible, however, for one or more of the layers to be formed from material which is not conductive. For example, second layer 24 can comprise an insulative or non-conductive material such as an inorganic anti-reflective coating (ARC) layer.

Figure 2:
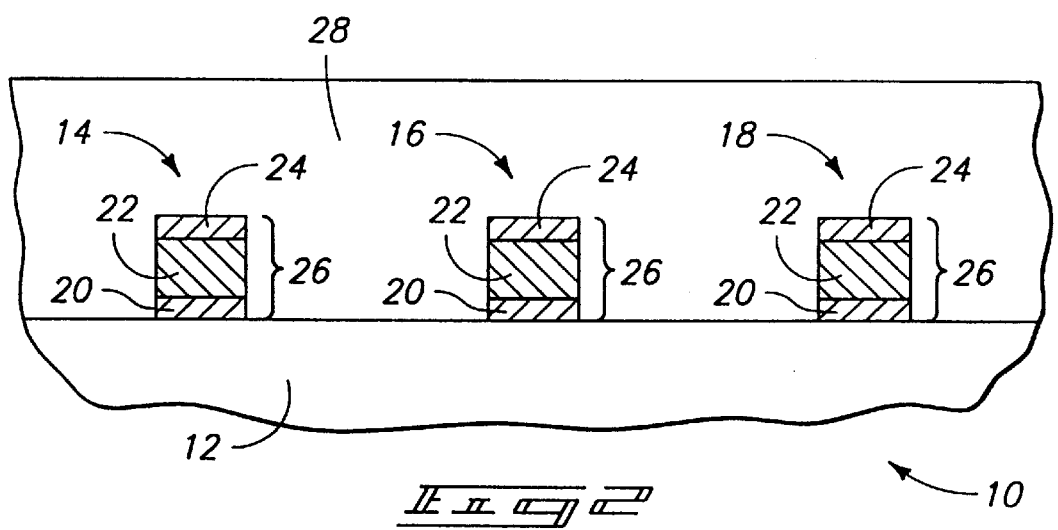
FIG. 2 is a view of the FIG. 1 wafer fragment at a different processing step.

Referring to FIG. 2, a masking layer 28 is formed over substrate 12 and assemblies 26. An exemplary material for masking layer 28 is photoresist.

Figure 3:
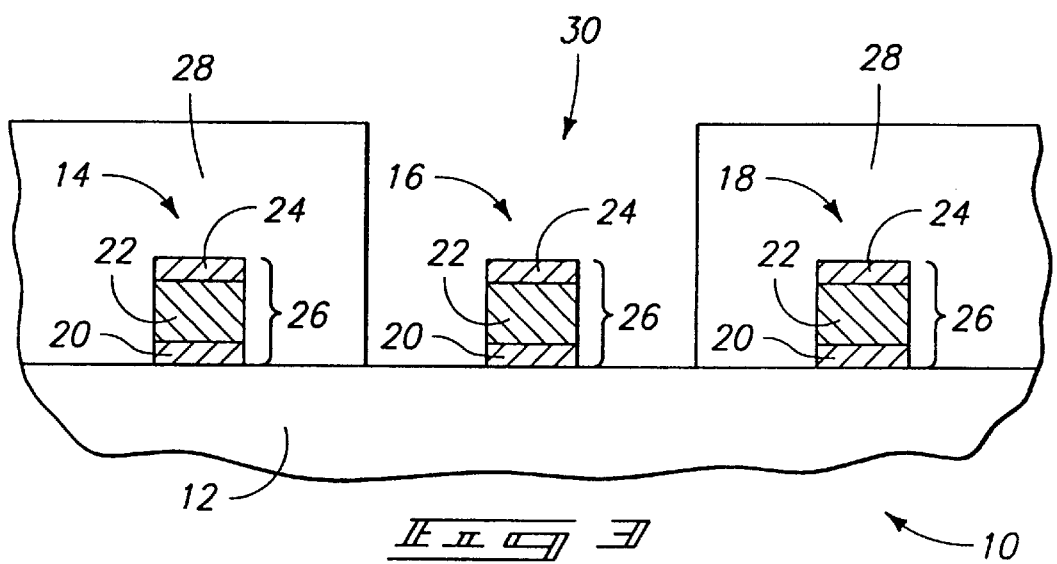
FIG. 3 is a view of the FIG. 1 wafer fragment at a different processing step.

Referring to FIG. 3, an opening 30 is formed through masking layer 28 and a portion of centermost assembly 26 is exposed. Opening 30 defines an area over the exposed assembly 26 in which a fuse is to be formed. The portion of the assembly which is exposed through the masking layer constitutes less than an entirety of the assembly which runs into and out of the plane of the page.

Figure 4:
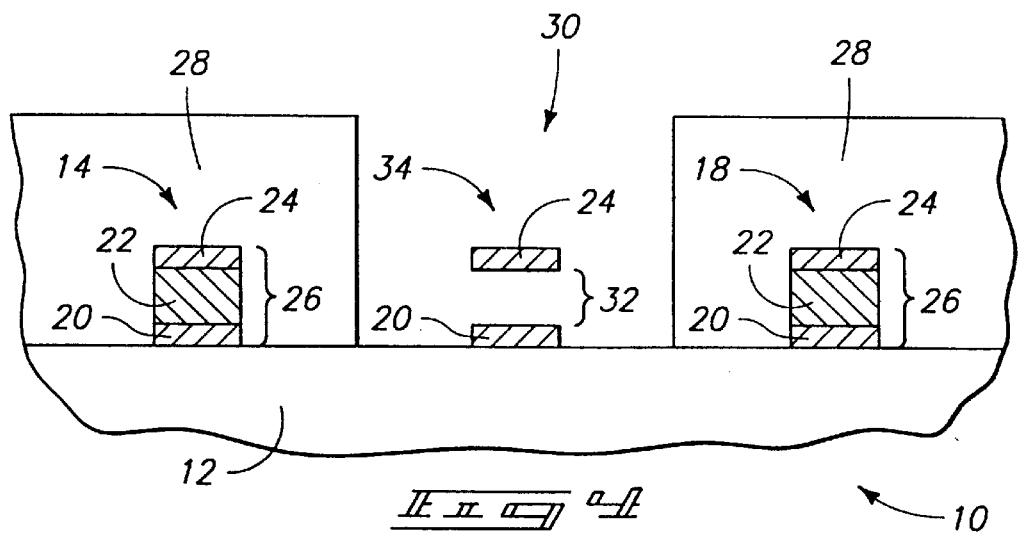
FIG. 4 is a view of the FIG. 1 wafer fragment at a different processing step.
Figure 5:
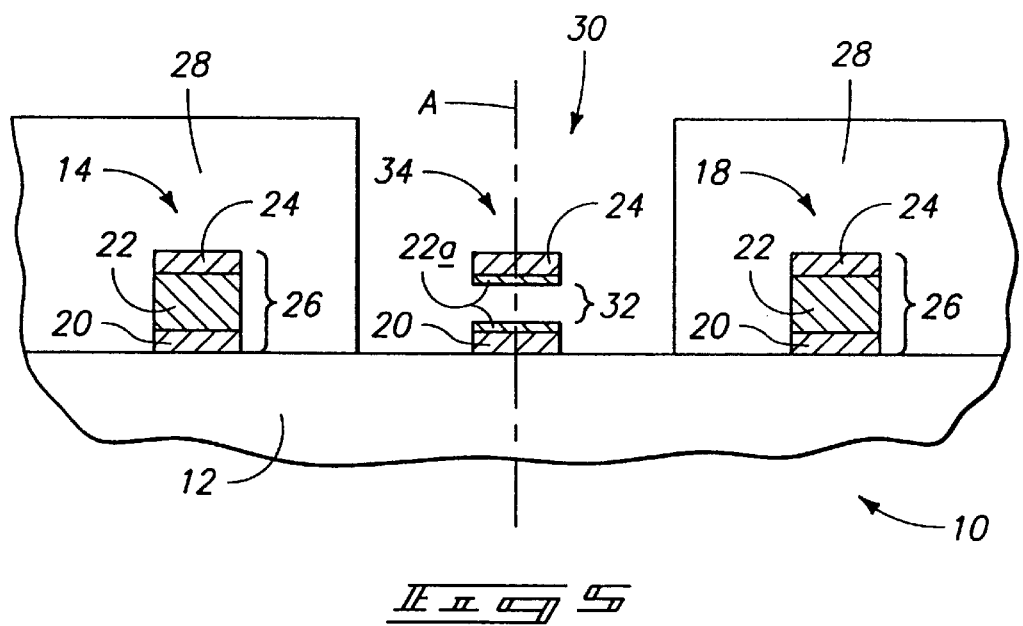
FIG. 5 is a view of the FIG. 1 wafer fragment at a processing step in accordance with an alternate aspect of the invention.

Referring to FIG. 4, at least a portion of first layer 22 is removed to define a void 32 intermediate base layer 20 and second layer 24. Layers 20, 24 are supported proximate the void by portions of layer 22 which are not removed and which are disposed into and out of the plane of the page. Such unremoved layer 22 portions are shown in more detail in FIG. 6. Collectively, the illustrated portions of layers 20, 24 and void 32 define a fuse area 34. In the FIG. 4 example, essentially all of first layer 22 is removed within fuse area 34. Such removal can be achieved by selectively etching the material comprising first layer 22 relative to the material comprising layers 20, 24. Where layers 20, 24 comprise titanium and layer 22 comprises aluminum, an exemplary etch is a wet etch which utilizes hot phosphoric acid at a temperature of around 90° C. at atmospheric pressure and for a duration appropriate to remove the layer. The duration of the etch can, however, be modified so that less than an entirety of first layer 22 is removed within fuse area 34. Such is accordingly shown in FIG. 5 at 22a where less than the entirety of layer 22 is removed along a shortest possible line "A" extending from one of the pair of conductive layers to the other of the pair of conductive layers and through void 32. Leaving an amount of a more conductive layer 22a behind may be desirable from the standpoint of reducing the overall resistivity of the fuse.

Figure 6:
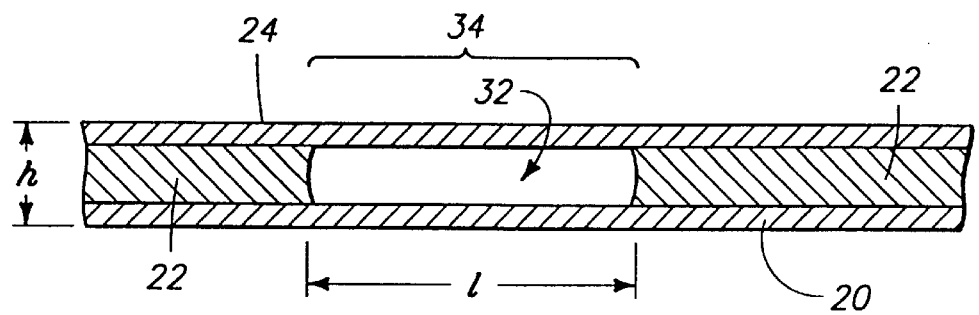
FIG. 6 is a side sectional view of an integrated circuitry fuse which is formed in accordance with one aspect of the invention.
Figure 7:
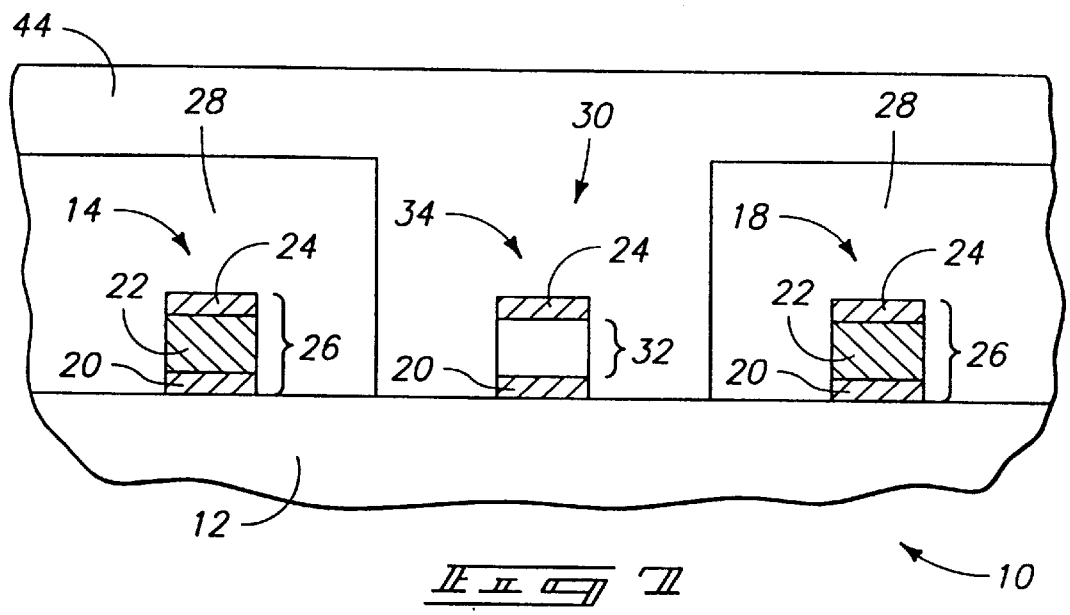
FIG. 7 is a view of the FIG. 1 wafer fragment at a different processing step.

Referring to FIG. 6, fuse area 34 is defined to have a length dimension l, a width dimension into and out of the page, and a height dimension h. Exemplary length dimensions are from between about 0.5 micron to 1 micron. An exemplary width dimension is around 0.25 micron. An exemplary height dimension is around 4000 Angstroms. Concurrent and subsequent processing to complete formation of integrated circuitry which incorporates one or more fuses can take place in accordance with conventional techniques. For example, FIG. 7 shows an additional layer of material 44 which has been formed over the substrate and in fuse area 34. In the illustrated example, material 44 is formed proximate void 32 and does not meaningfully fill the void. Such provides an air or vacuum gap proximate the illustrated layers and within void 32. The air or vacuum gap can desirably lower the programming voltage necessary to blow the fuse. An exemplary material for material 44 is a dielectric material which can be formed through plasma enhanced chemical vapor deposition techniques. Such deposition provides a substantially enclosed void, with the exemplary void being enclosed by material of layers 20, 22, 24 and 44.

Figure 8:
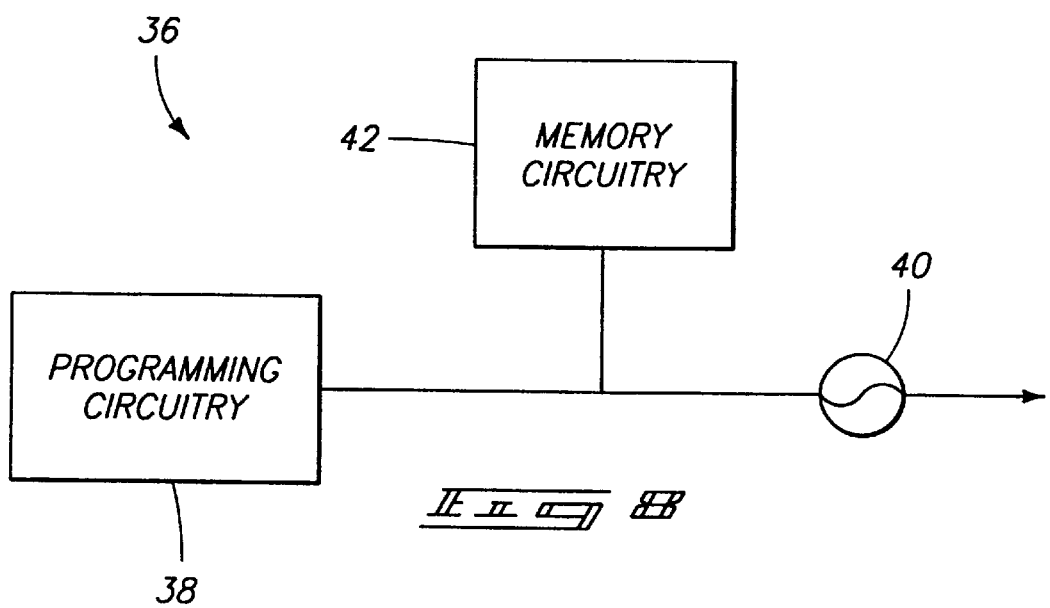
FIG. 8 is a high level diagram of integrated circuitry which is provided or formed in accordance with one aspect of the invention.

Referring to FIG. 8, an exemplary implementation comprising integrated circuitry formed in accordance with the above-described methodology is shown generally at 36. Programming circuitry 38 is provided and is operably connected with a fuse 40 which has been formed in accordance with the above-described methodology. Memory circuitry 42 is provided and is operably coupled with programming circuitry 38 and fuse 40. In one preferred aspect, programming circuitry 38 comprises at least one MOS device which is formed over the same substrate upon which fuse 40 is supported. Fuse 40 can be exposed to a programming voltage through programming circuitry 38 which is sufficient to blow the fuse. In the illustrated example, MOS devices comprising programming circuitry 38 have breakdown voltages associated with breakdown of the source/drain-to-substrate junction and breakdown of the gate oxide. In one aspect, fuse 40 can be programmed with a programming voltage which is no higher than the breakdown voltage of the MOS devices comprising programming circuitry 38. An exemplary programming voltage can be provided which is less than 10 volts. In a preferred aspect, the programming voltage is no greater than about 5 volts. In this way, MOS devices can be utilized to route a programming signal to fuse 40. Such programming signal is accordingly provided by a programming voltage which is no greater than the breakdown voltage of the MOS devices.

Figure 9:
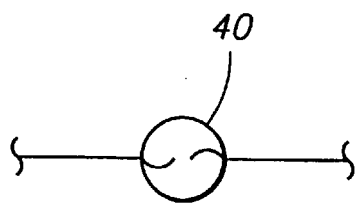
FIG. 9 is a diagram of a portion of the FIG. 8 diagram, with the illustrated fusing having been programmed or blown.

Referring to FIG. 9, fuse 40 has been suitably programmed through the programming circuitry.

The above-described methodologies and structures reduce the wafer real estate which is needed to provide suitable programming voltages and signals to programmable integrated circuitry devices. Such is accomplished in one aspect by reducing, if not eliminating all together, the need for large dedicated contact pads for each fuse. In other aspects, fuses formed in accordance with the invention can be tied to a suitable contact pad and programmed accordingly. Additionally, the above-described methodologies and structures enable programming to be conducted at locations other than locations where such devices are fabricated. Specifically, a programmer can suitably program devices which incorporate the above-described structures at the programmer's own facility.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An integrated circuitry fuse forming method comprising:
    forming a first, second and third layers of material above a semiconductor substrate, wherein forming the first, second and third layers comprises forming the first, second and third layers from conductive materials; and removing a portion of the second layer from below the third layer to provide a fuse comprising the first layer.

2. The method of claim 1, wherein removing includes removing a portion of the second layer from below the third layer to form a void having the third layer as a conductive interconnect extending across the fuse area and further comprising forming a dielectric on the fuse area to seal the void.

3. The method of claim 1, wherein forming the first, second and third layers comprises forming the second layer from a different material than that used in forming the first layer.

4. The method of claim 1 further comprising, after removing, forming a dielectric material layer over the substrate within the fuse area, at least some of the dielectric material layer being disposed proximate an area where the second layer portion was removed.

5. The method of claim 1, wherein removing comprises selectively etching a portion of the second layer relative to the third layer.

6. The method of claim 1, wherein forming the first, second and third layers comprises:
   forming the first and third layers to comprise titanium; and
   forming the second layer to comprise aluminum, and wherein removing comprises removing aluminum selectively relative to titanium.

7. The method of claim 6, wherein forming the second layer comprises forming an AlCu layer.

8. The method of claim 1, wherein forming the second layer comprises forming a layer comprising aluminum.

9. The method of claim 8, wherein removing comprises removing essentially all of the aluminum within the fuse area.

10. An integrated circuitry fuse forming method comprising:
    forming a first layer of conductive material above a substrate;
    forming a second layer of conductive material above the first layer;
    forming a third layer of conductive material above the second layer;
    forming a masking layer over the first, second and third layers;
    exposing portions of the second and third layers through the masking layer; and
    selectively etching material comprising the second layer from beneath the third layer.

11. The method of claim 10, wherein forming the first layer and forming the second layer comprise forming the second layer from a different material than that used in forming the first layer.

12. The method of claim 10, further comprising, after etching, forming a dielectric layer over the substrate within the fuse area, at least some of the dielectric layer being disposed proximate an area from where the second layer was etched.

13. The method of claim 10, further comprising, forming the first layer of conductive material over the substrate, wherein forming the second and third layers comprises forming the layers in conductive connection with the first layer.

14. The method of claim 13, wherein selectively removing comprises selectively etching the second layer relative to the first layer, thereby forming a void between the first and third layers.

15. The method of claim 14, further comprising, after etching, forming a dielectric material layer over the substrate, material of the first, second, third and dielectric layers substantially enclosing the void.

16. An integrated circuitry fuse forming method comprising:
    forming an assembly of layers comprising at least one layer between two separately-formed conductive layers, wherein forming the at least one layer comprises forming a metal alloy layer; and
    removing at least a portion of the one layer from between the two separately-formed layers and leaving at least one of the two separately-formed layers over where at least a portion of the one layer was removed, the assembly of layers providing a fuse.

17. The method of claim 16, wherein removing at least a portion of the one layer comprises selectively etching the one layer relative to at least one of the two conductive layers.

18. The method of claim 16, wherein removing at least a portion of the one layer comprises selectively etching the one layer relative to both of the conductive layers.

19. The method of claim 18, wherein forming the at least one layer comprises forming the at least one layer to comprise aluminum.

20. The method of claim 18, wherein forming the at least one layer comprises forming the at least one layer to comprise AlCu.

21. An integrated circuitry fuse forming method comprising:
    forming an assembly of layers comprising at least one layer between two separately-formed conductive layers; and
    removing at least a portion of the one layer from between the two separately-formed layers and leaving at least one of the two separately-formed layers over where at least a portion of the one layer was removed, the assembly of layers providing a fuse, wherein forming the at least one layer comprises forming the at least one layer from a material selected from a group consisting of aluminum, silver, copper and gold.

22. The method of claim 16, wherein forming the assembly of layers comprises:
    forming the two conductive layers to comprise titanium; and
    forming the at least one layer between the two separately-formed conductive layers comprises forming the at least one layer to comprise aluminum.

23. An integrated circuitry fuse forming method comprising:
    forming an assembly of layers comprising at least one layer disposed intermediate two separately-formed conductive layers, wherein the at least one layer comprises a material which is more conductive than either of the two separately-formed conductive layers; and
    selectively etching substantially all of the one layer within a portion of the assembly relative to the two conductive layers and leaving one of the two conductive layers spanning over an area within which the one layer was etched.

24. The method of claim 23, wherein at least one of the two conductive layers comprises titanium.

25. The method of claim 23, wherein both of the two conductive layers comprise titanium.

26. The method of claim 23, wherein the at least one layer comprises aluminum.

27. The method of claim 26, wherein at least one of the two separately-formed conductive layers comprises titanium.

28. The method of claim 23, wherein the at least one layer is etchably different from the two conductive layers.

29. An integrated circuitry fuse forming method comprising:
   forming an assembly of elevationally-separated layers above a semiconductive wafer, the layers comprising one layer disposed elevationally between a pair of conductive layers, wherein the one layer comprises a metal; and
   selectively removing a portion of the one layer relative to the pair of conductive layers to define a void between the pair of conductive layers.

30. The method of claim 29 wherein selectively removing comprises selectively etching the one layer relative to the pair of conductive layers to define the void.

31. The method of claim 30, further comprising, after removing the portion of the one layer, forming another layer of material proximate the void which, together with material of the assembly of layers, substantially encloses the void.

32. The method of claim 29, wherein the one layer comprises aluminum.

33. The method of claim 29, wherein at least one of the pair of conductive layers comprises titanium.

* * * * *